United States Patent
Hoban, Jr. et al.

(10) Patent No.: US 9,429,126 B2
(45) Date of Patent: Aug. 30, 2016

(54) SYSTEM AND METHOD FOR DETECTING SHORT-TO-GROUND FAULT

(71) Applicant: Caterpillar Inc., Peoria, IL (US)

(72) Inventors: William E. Hoban, Jr., Dunlap, IL (US); Sreekumar Regu Girijakumari, Chennai (IN)

(73) Assignee: Caterpillar Inc., Peoria, IL (US)

(*) Notice: Subject to any disclaimer, the term of this patent is extended or adjusted under 35 U.S.C. 154(b) by 267 days.

(21) Appl. No.: 14/296,518

(22) Filed: Jun. 5, 2014

(65) Prior Publication Data

US 2015/0354522 A1    Dec. 10, 2015

(51) Int. Cl.
*F02M 65/00* (2006.01)
*G01R 31/00* (2006.01)
*G01R 31/02* (2006.01)
*F02D 41/22* (2006.01)
*F02D 41/20* (2006.01)

(52) U.S. Cl.
CPC ............ *F02M 65/00* (2013.01); *F02D 41/221* (2013.01); *F02M 65/008* (2013.01); *G01R 31/005* (2013.01); *G01R 31/025* (2013.01); *F02D 2041/2093* (2013.01)

(58) Field of Classification Search
CPC .. G01R 31/025; G01R 31/005; F02M 65/00; F02M 65/005
See application file for complete search history.

(56) References Cited

U.S. PATENT DOCUMENTS

| 4,589,401 A  * | 5/1986  | Karim ...................... F02D 41/20 123/479 |
| 5,507,264 A  * | 4/1996  | Kugler ...................... F02P 17/12 123/481 |
| 6,133,653 A  * | 10/2000 | Gaskins ................ H01H 47/325 307/104 |
| 6,935,308 B1 * | 8/2005  | Nakamoto ............ F02D 11/105 123/395 |
| 7,497,204 B2   | 3/2009  | Perryman et al. |
| 8,248,074 B2   | 8/2012  | Perryman et al. |
| 8,436,623 B2   | 5/2013  | Oura et al. |
| 2011/0047978 A1* | 3/2011 | Zawacki ............. F02D 41/1494 60/277 |
| 2013/0019670 A1* | 1/2013 | Jung ..................... F02D 41/221 73/114.51 |
| 2014/0012484 A1 | 1/2014 | Love et al. |

FOREIGN PATENT DOCUMENTS

JP    H0814091 A    1/1996
JP    2013221415 A   10/2013

* cited by examiner

*Primary Examiner* — Jeff Natalini
(74) *Attorney, Agent, or Firm* — Carl E. Myers

(57) ABSTRACT

A method of detecting a resistive short-to-ground fault in an injector driver circuit is disclosed. The method includes determining if the injector driver circuit is in an inactive state and providing a pull-up resistor configured for connection to a low-side output of at least one fuel injector. The method further includes selectively enabling a pull-up voltage across the pull-up resistor only when the injector driver circuit is in the inactive state and determining an intersection voltage at a point between the pull-up resistor and the low-side output. The method further includes comparing the intersection voltage with a predetermined reference voltage. The method further includes disabling the injector driver circuit if the short-to-ground fault is detected at the low-side of the fuel injectors.

20 Claims, 3 Drawing Sheets

SYSTEM AND METHOD FOR DETECTING SHORT-TO-GROUND FAULT

TECHNICAL FIELD

The present disclosure generally relates to a fuel injection system for an engine, and more specifically to a system and method for detecting short-to-ground fault in the fuel injection system.

BACKGROUND

Engines typically include fuel injectors to supply fuel to one or more cylinders of the engine. The fuel injectors are generally regulated by a controller to deliver predetermined quantities of fuel to the cylinders at predetermined times.

During operation of the engine, a fault may occur due to short-circuiting of one or more fuel injectors to ground. In fuel injection systems where multiple fuel injectors share electrical connections, the short-circuiting of one of fuel injectors may lead to unintended actuation of the other injectors. Therefore, such faults may cause over-fueling and/or untimely fueling in one or more cylinders. Untimely fueling may also lead to false firing in some cylinders. Detection of direct short-to-ground faults is known in the art. However, resistive short-to-ground faults may not be detected, and may lead to damage to various components of the engine.

U.S. Publication Number 2014/0012484 discloses a system and method for fault diagnosis in a fuel injection system having first and second fuel injectors. The method includes initiating a current flow in the first and second fuel injectors and measuring rise duration of the current flow to reach a threshold level. The method further includes comparing the rise duration and a preset duration and controlling the fuel injection system based on the comparison between the rise duration and the preset duration.

SUMMARY OF THE DISCLOSURE

In one aspect of the present disclosure, a method of detecting a resistive short-to-ground fault in an injector driver circuit is provided. The method includes determining if the injector driver circuit is in an inactive state and providing a pull-up resistor configured for connection to a low-side output of at least one fuel injector. The method further includes selectively enabling a pull-up voltage across the pull-up resistor only when the injector driver circuit is in the inactive state and determining an intersection voltage at a point between the pull-up resistor and the low-side output. The method further includes comparing the intersection voltage to a predetermined reference voltage.

In another aspect of the present disclosure, a fault detection system for detecting a resistive short-to-ground fault in an injector driver circuit is provided. The fault detection system includes a state detection module configured to detect whether the injector driver circuit is in an inactive state. The fault detection system further includes a pull-up module operatively coupled to the state detection module. The pull-up module includes a pull-up resistor connected to a low-side output of the fuel injector. The pull-up module is further configured to selectively enable a pull-up voltage applied across the pull-up resistor only when the injector driver circuit is in the inactive state and determine an intersection voltage at a point between the pull-up resistor and the low-side output of the fuel injector. The fault detection system further includes an output module operatively coupled to the state detection module and the pull-up module. The output module is configured to compare the intersection voltage with the predetermined reference voltage.

In yet another aspect of the present disclosure, an injector driver circuit for a fuel injection system having a plurality of fuel injectors is provided. The injector driver circuit includes a power source and a selector switch associated with each of the plurality of the fuel injectors located on a low-side output of each of the fuel injectors. Each selector switch is configured to selectively connect and disconnect an associated fuel injector to allow power from the power source to pass through the associated fuel injector. The injector driver circuit further includes a fault detection system configured to detect a resistive short-to-ground fault in the injector driver circuit. The fault detection system includes a state detection module operatively coupled to the selector switch of at least one of the fuel injectors. The state detection module is configured to detect a state of the injector driver circuit. The fault detection system further includes a pull-up module operatively coupled to the state detection module. The pull-up module includes a pull-up resistor connected across low-side output of at least one of the plurality of fuel injectors. The pull-up module is configured to selectively enable a pull-up voltage applied across the pull-up resistor only when the injector driver circuit is in an inactive state and determine an intersection voltage at a point between the pull-up resistor and the low-side output of the fuel injectors. The fault detection system further includes an output module operatively coupled to the state detection module and the pull-up module. The output module is configured to compare the intersection voltage with the predetermined reference voltage.

DETAILED DESCRIPTION

Figure 1:
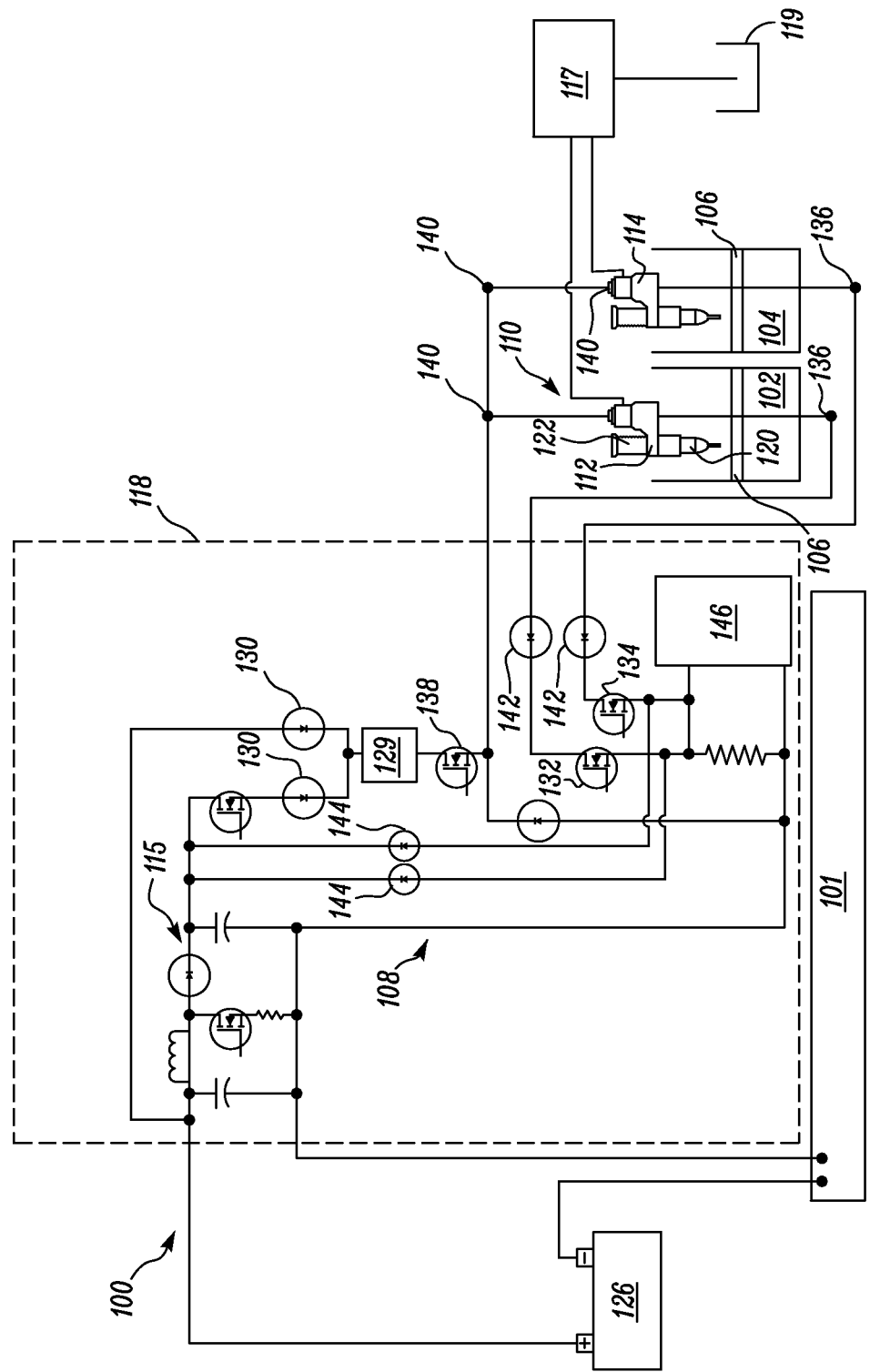
FIG. 1 illustrates an exemplary fuel injection system of an engine, according to an embodiment of the present disclosure.

The present disclosure will now be described in detail with reference being made to accompanying figures. Referring to FIG. 1, an engine system 100, such as an automotive vehicle or construction machinery engine is generally shown. The engine system 100 may include an engine block 101 having a number of cylinders disposed in any one of an inline configuration, a V-configuration, a W-configuration, or an X-configuration, etc. For the purpose of illustration, FIG. 1 shows only one cylinder set having a first cylinder 102 and a second cylinder 104. However, the engine block 101 may include a plurality of cylinder sets, each with the first cylinder 102 and the second cylinder 104. Each of the cylinder sets may also include any number of cylinders. As shown in FIG. 1, each of the first and the second cylinders 102, 104 include respective pistons 106, which reciprocate in the corresponding cylinders due to pressure energy generated by combustion of fuel inside the cylinders.

Figure 2:
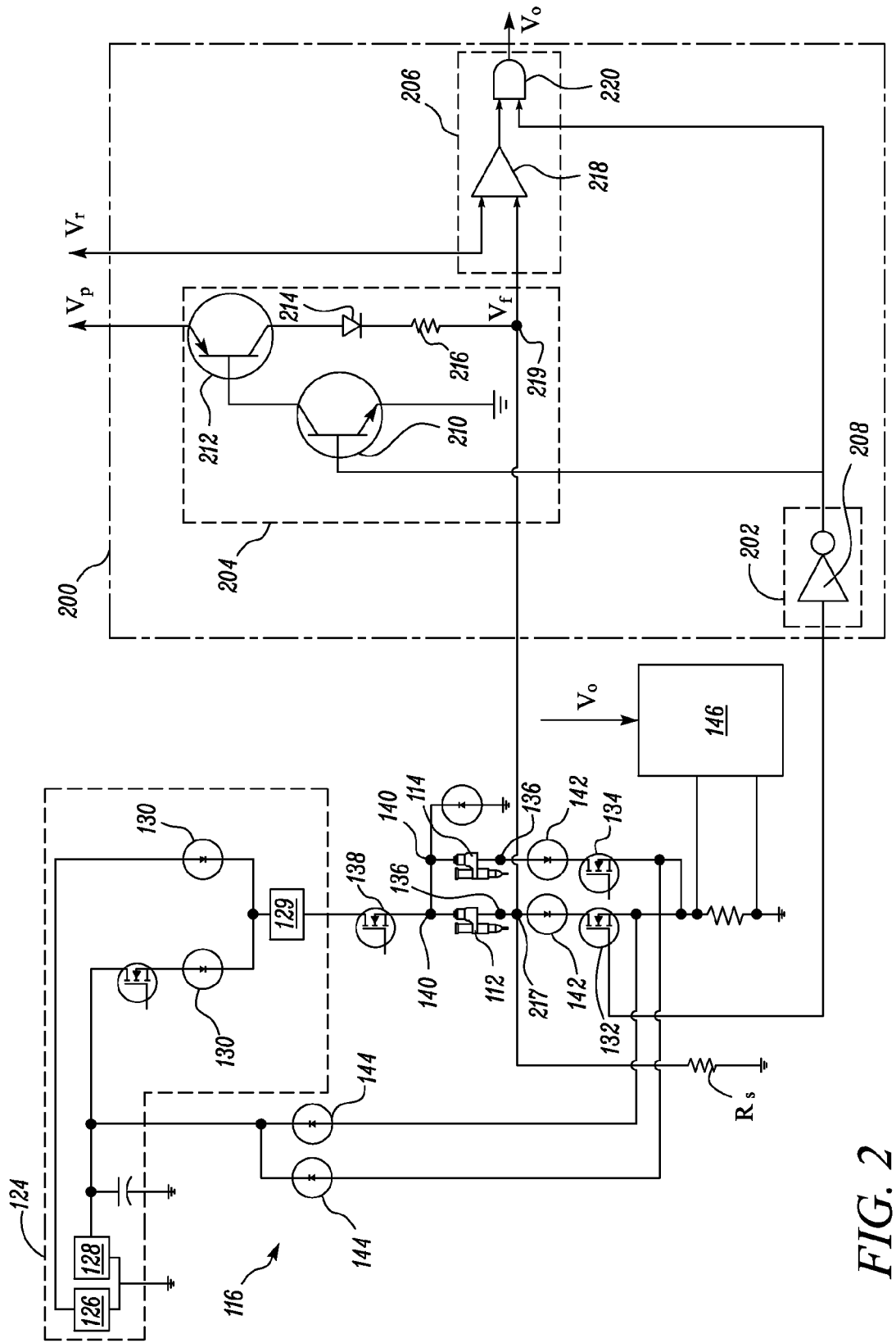
FIG. 2 illustrates an injector driver circuit of the fuel injection system, according to an embodiment of the present disclosure.

Further, as illustrated in FIG. 1, the engine system 100 includes a fuel injection system 108 which supplies fuel into the cylinders 102, 104. In various examples, the fuel injection system 108 may be employed in a diesel engine to inject diesel fuel, or in a spark ignited internal combustion engine to inject combustible gasoline. The fuel injection system 108 includes an injector bank 110 having a first fuel injector 112 and a second fuel injector 114, in association with the first cylinder 102 and the second cylinder 104, respectively. In an embodiment, the fuel injection system 108 may be a common rail fuel injection system such that a single rail 117 may supply fuel to the first and second fuel injectors 112, 114 from a fuel source 119. In various embodiments, multiple rails (not shown) may be provided to supply various types of fuel to facilitate a multi-fuel operation. The first and second fuel injectors 112, 114 may be electrically actuated to inject the fuel into the first and second cylinders 102, 104. In an embodiment, as illustrated in FIG. 2, the fuel injection system 108 may include a plurality of injector banks 110 associated with each cylinder set. Further, the injector bank 110 may include more than two fuel injectors, depending on the number of cylinders in each cylinder set.

In an embodiment of the present disclosure, the fuel injection system 108 may employ an injector driver circuit 116 (hereinafter referred to as "the driver circuit 116") for each of the injector banks 110. The driver circuit 116 may be associated with the injector bank 110, to monitor and control the first and second fuel injectors 112, 114. The driver circuit 116 may form a part of an Engine Control Module (ECM) 118. The ECM 118 may include a microprocessor and a memory which are arranged to perform various routines to control the operation of the engine system 100. For example, the ECM 118 may monitor engine speed and load, and provide a feedback to the driver circuit 116 to control timing of operation and amount of fuel supplied to the fuel injectors 112, 114. Further, the driver circuit 116 may receive signals indicating the reciprocation of the pistons 106 in the first and the second cylinders 102, 104, and accordingly actuate the first and second fuel injectors 112, 114 to supply the fuel.

As shown in FIG. 1, each of the first and second fuel injectors 112, 114, in the injector bank 110, includes an injection valve 120 and an actuator 122. The actuator 122 may be any one of a solenoid coil, a piezoelectric actuator, and the like. The actuator 122 may be operable by the driver circuit 116 to cause the injector valve 120 to open and close, in order to control the injection of the fuel into the associated cylinders.

FIG. 2 illustrates a detailed embodiment of the driver circuit 116. The driver circuit 116 may include a power source 124. In an embodiment, the power source 124 may be a combination of, for example, but not limited to, a battery 126, and a High Voltage Power Supply (HVPS) 128 working in conjunction, via a current mirror 129 and a pair of diodes 130. A boost circuit 115, shown in FIG. 1, may be associated with the HVPS 128 to amplify a voltage received from the battery 126. Such an arrangement may provide voltage proportional to the load by the first and second fuel injectors 112, 114. The driver circuit 116 may also include means for noise suppression, such as, a capacitor, or the like connected to the power source 124.

The driver circuit 116 includes a first selector switch 132 and a second selector switch 134, disposed in a low-side, that is, between the first fuel injector 112 and the second fuel injector 114, respectively, and a negative terminal of the power source 124. The negative terminal of the power source 124 may be further connected to ground via the engine block 101, as shown in FIG. 1. The first and second selector switches 132, 134 may be connected to first terminals 136 of the first and second fuel injectors 112, 114, and controllably connect and disconnect the first and second fuel injectors 112, 114 to and from the power source 124. The low-side of the driver circuit 116 on the side of the first terminals 136 may correspond to a low-side output of the first and second fuel injectors 112 and 114. Further, the driver circuit 116 may include a multiplexed switch 138 disposed in a high-side, that is, between the first fuel injector 112 and the second fuel injector 114, respectively, and a positive terminal of the power source 124. The multiplexed switch 138 is connected to second terminals 140 of the first and second fuel injectors 112, 114 to controllably connect and disconnect the first and second fuel injectors 112, 114 to and from the power source 124.

In an embodiment of the present disclosure, the first and second selector switches 132, 134 are field effect transistors (FET's) with a drain connected to the first and second fuel injectors 112, 114, respectively. Similarly, the multiplexed switch 138 may also be a field effect transistor (FET) with a drain in connection with the first and second fuel injectors 112, 114. In particular, the power source 124, the multiplexed switch 138, and the first and second switches 132, 134 may selectively form a closed loop electrical circuit with the high-side and low-side of the first and second fuel injectors 112, 114. In another embodiment, the driver circuit 116 of the present disclosure may use n-type MOSFET as switches 132, 134, 138. In various implementations, the injector banks 110 of the fuel injection system 108 share the low-side, that is, each of the injector banks 110 is connected to the same first and second selector switches 132, 134. Further, the first and second fuel injectors 112, 114 in each of the injector banks 110 may share the multiplexed switch 138 on their high-side between the power source and the fuel injectors.

In an embodiment, the driver circuit 116 may include diodes 142 disposed at the low-sides of the first and second fuel injectors 112, 114. In various other embodiments, the diodes 142 may not be provided. However, in case the first and second fuel injectors 112, 114 share a single injector switch (not shown) on the low-side, the diodes 142 may prevent flow of current from one of the first and second fuel injectors 112, 114 to the other fuel injector. In an embodiment, the driver circuit 116 includes a controller 146 for controlling the fuel injection system 108. Generally, the controller 146 may be a combination of, but not limited to, a processor, a Read Only Memory, a Random-Access Memory, a Logic Unit, etc. The controller 146 may primarily control the first and second selector switches 132, 134 and the multiplexed switch 138 in order to control the current flow through the driver circuit 116, and therefore the first and second fuel injectors 112, 114 for injection of the fuel.

The controller 146 may be operable to selectively trigger the first and second fuel injectors 112, 114 at desired points in time, by closing the multiplexed switch 138 while operating the first and second selector switches 132, 134 in alternating on and off states, whereby a first average magnitude of current is supplied to the first fuel injector 112 during a first period of time and a second average magnitude of current is supplied to the second fuel injector 114 during a second period of time subsequent to the first period of time. Thus, the first and second fuel injectors 112, 114 are active or inactive based on signals from the controller 146. In an embodiment, the controller 146 may be communicably coupled to an operator interface (not shown). The operator interface may include one or more buttons, levers, displays, and the like, in order to receive various operator inputs and communicate output status of the driver circuit 116 with the operator.

In the embodiment of FIG. 2, a fault detection system 200 is provided to detect a resistive short-to-ground fault in the driver circuit 116. The fault detection system 200 may include a state detection module 202, a pull-up module 204 and an output module 206. The state detection module 202 may be operatively connected to the first selector switch 132 on the low-side output of the first fuel injector 112. The state detection module 202 may detect a state of the first fuel injector 112, that is, whether the first fuel injector 112 is active or inactive. As shown in FIG. 2, the state detection module 202 includes a first switch 208 operatively connected to the first selector switch 132. Further, the first switch 208 may provide a high state output when the driver circuit 116 is in the inactive state. The first switch 208 provides a low state output when the first fuel injector 112 of the driver circuit 116 is in the active state. Therefore, the first switch 208 may function as a logical NOT gate. In various embodiments, the first switch 208 may include one or more electronic components in order to implement the logical NOT operation. The first and second fuel injectors 112, 114 may both be inactive if the driver circuit 116 is inactive or disabled. Thus, the state detection module 202 may be alternatively connected to the second selector switch 134 corresponding to the second fuel injector 114 in order to detect an inactive state of the driver circuit 116.

The fault detection system 200 further includes the pull-up module 204 that is operatively coupled with the state detection module 202. The pull-up module 204 includes a first switching device 210 and a second switching device 212. In the embodiment of FIG. 2, each of the first switching device 210 and the second switching device 212 may be a Bipolar Junction Transistor (BJT). The first switching device 210 may be a NPN transistor and the second switching device 212 may be a PNP transistor. In various alternative embodiments, the first switching device 210 and the second switching device 212 may be selected from other types of electronic switching devices such as, for example, MOSFET, IGBT, etc.

The first switching device 210 may include a base region that is operatively coupled with the first switch 208 of the state detection module 202 so as to receive the output of the first switch 208. An emitter region of the first switching device 210 may be connected to ground while a collector region thereof may be coupled to a base region of the second switching device 212. The second switching device 212 includes an emitter region that may receive a pull-up voltage $V_p$. The pull-up voltage $V_p$ may be provided from various voltage sources, for example, a voltage supply associated with the ECM 118 of the engine system 100. In an embodiment, the controller 146 may be configured to activate or deactivate the pull-up voltage $V_p$. Further, the controller 146 may also be configured to regulate a value of the pull-up voltage $V_p$. The controller 146 may control the pull-up voltage $V_p$ based on user inputs received via the operator interface. Alternatively, the controller 146 may control the pull-up voltage $V_p$ based on predetermined instructions stored in a memory accessible by the controller 146. A collector region of the second switching device 212 may be electronically coupled with a diode 214. In an embodiment, the first switching device 210 may allow flow of current therethrough if the base region receives a high state output from the first switch 208 of the state detection module 202. Similarly, the second switching device 212 may allow flow of current therethrough if a high state output from the collector region of the first switching device 210 is fed to the base region of the second switching device 212. Both the first switching device 210 and the second switching device 212 may not allow flow of current if the base region of each receives a low state output.

As shown in FIG. 2, the diode 214 is further connected to a pull-up resistor 216 in a series configuration. The diode 214 may allow a unidirectional current flow from the collector region of the second switching device 212 to towards the pull-up resistor 216. The pull-up resistor 216 is further connected with the low-side output of the first fuel injector 112 at point 217. The point 217 is disposed between the first fuel injector 112 and the diode 142. As shown in FIG. 2, a short-to-ground resistance $R_s$ exists between the point 217 and ground. The short-to-ground resistance $R_s$ may be considered as an exemplary resistive short-to-ground fault in the driver circuit 116. The short-to-ground resistance $R_s$ is shown for illustration purposes only, and the short-to-ground resistance $R_s$ may be absent in case there is no short-to-ground fault. Ground may be considered as an electrical ground which may act as a reference for all signals within the driver circuit 116.

In various implementations of this disclosure, a value of the pull-up voltage $V_p$ and a resistance value of the pull-up resistor 216 may be based at least in part on a desired detectable amount of the short-to-ground resistance $R_s$ between the low-side output of the first fuel injector 112 and ground. The pull-up resistor 216 may be a variable resistor whose resistance value may be adjusted by the operator interface associated with the controller 146.

The first and second switching devices 210, 212 of the pull-up module 204 may selectively enable the pull-up voltage $V_p$ across the pull-up resistor 216 only when the driver circuit 116 is in the inactive state. Further, the pull-up module 204 may determine an intersection voltage $V_f$ at a point 219 between the pull-up resistor 216 and the point 217 which is located on the low-side output of the first fuel injector 112. The point 219, as shown in FIG. 2, is exemplary in nature and the point 219 may be located anywhere between the pull-up resistor 216 and the point 217. In an embodiment, the intersection voltage $V_f$ may be measured as a voltage drop across the short-to-ground resistance $R_s$ considered to be the resistive short-to-ground fault. The pull-up resistor 216 and the short-to-ground resistance $R_s$ may together form a voltage divider for the pull-up voltage $V_p$. Thus, the intersection voltage $V_f$ may be based on a ratio between the short-to-ground resistance $R_s$ and a sum of the pull-up resistance and the resistance $R_s$. Further, the intersection voltage $V_f$ may also be dependent on a voltage drop across the collector and emitter region of the second switching device 212, and a voltage drop across the diode 214. These voltage drops may be inherent characteristics of the second switching device 212 and the diode 214.

The fault detection system 200 further includes the output module 206 that is operatively coupled with the pull-up module 204 and the state detection module 202. The output module 206 includes a voltage comparator 218 that is operatively coupled to the pull-up module 204. In an embodiment, the voltage comparator 218 may include two input terminals and an output terminal. One of the input terminals may receive a predetermined reference voltage $V_r$ (hereinafter referred to as "the reference voltage $V_r$"). The reference voltage $V_r$ may be provided from various voltage sources, for example, a voltage supply associated with the ECM 118 of the engine system 100. In an embodiment, the controller 146 may be configured to activate or deactivate the reference voltage $V_r$. Further, the controller 146 may also be configured to regulate a value of the reference voltage $V_r$. The controller 146 may control the reference voltage $V_r$ based on user inputs received via the operator interface. Alternatively, the controller 146 may control the reference voltage $V_r$ based on predetermined instructions.

In various implementations, a voltage value of the reference voltage $V_r$ may be based at least in part on the amount of the short-to-ground resistance $R_s$ considered to be the resistive short-to-ground fault. The other input terminal of the voltage comparator 218 may be connected to the point 219 of the pull-up module 204. The voltage comparator 218 may compare the intersection voltage $V_f$ with the reference voltage $V_r$. The voltage comparator 218 may provide a high state output when the intersection voltage $V_f$ is less than the reference voltage $V_r$, and provide a low state output when the intersection voltage $V_f$ is higher than the reference voltage $V_r$. The output module 206 further includes a second switch 220 that is operatively coupled with the voltage comparator 218 and the state detection module 202. The second switch 220 may include two input terminals and one output terminal. One of the input terminals of the second switch 220 may receive the output from the voltage comparator 218. The other input terminal may receive the output from the first switch 208 of the state detection module 202.

In the illustrated exemplary embodiment, the second switch 220 may be configured to perform a logical AND operation. Therefore, the output module 206 may provide a high state output $V_o$ via the output terminal of the second switch 220 when the output from the voltage comparator 218 is in the high state and the driver circuit 116 is in the inactive state. Further, the output module 206 may provide a low state output when either of the output from the voltage comparator 218 and the first switch 208 is in the low state. The high state output $V_o$ of the output module 206 may correspond to a fault signal output indicative of a resistive short-to-ground fault in the driver circuit 116. The low state output of the output module 206 may correspond to a no fault signal output.

In various alternative implementations, the output module 206 may include an inverter switch (not shown) that may be coupled with the output terminal of the first switch 220 to invert the output of the second switch 220. Thus, the output module 206 may provide a low state output when the output from the voltage comparator 218 is in the high state and the driver circuit 116 is in the inactive state. Further, the output module 206 may provide a high state output when either of the output from the voltage comparator 218 and the first switch 208 is in the low state. The low state output of the output module 206 may correspond to a fault signal output indicative of a resistive short-to-ground fault in the driver circuit 116. The high state output of the output module 206 may correspond to a no fault signal output.

In various implementations, the high state output $V_o$ of the second switch 220 may be communicated to the controller 146. The controller 146 may then communicate a signal to the operator interface indicative of the output of the second switch 220. The operator interface may indicate the presence or absence of a short-to-ground fault in various manners, for example, an audio feedback, a visual feedback, a tactile feedback, or a combination thereof.

The fault detection system 200, as described above, may be configured to detect a short-to-ground fault in the first fuel injector 112. In various implementations, the low-side of each of the fuel injectors (for example, including the second fuel injector 114) connected with separate fault detection system 200 in order to detect short-to-ground fault at the low-side of each of the first and second fuel injectors 112, 114. Therefore, the short-to-ground fault associated with the first and second cylinders 102, 104 may be detected independently. Further, the controller 146 may also be able to determine which of the first and second fuel injectors 112, 114 associated with the first and second cylinders 102, 104 have a short-to-ground fault.

INDUSTRIAL APPLICABILITY

During operation of an engine, a fault may occur due to short-circuiting of one or more fuel injectors to ground. In fuel injection systems where multiple fuel injectors share electrical connections, the short-circuiting of one of the fuel injectors may lead to unintended actuation of the other injectors. Detection of direct short-to-ground faults may be more easily detected as a result of such a fault offering virtually no resistance to current flow to ground. However, resistive short-to-ground faults may escape detection as a result of these types of faults offering some amount of resistance to current flow to ground. Resistive short-to-ground faults may still result in unintended actuation of injectors, and therefore may result in significant damage to various components of the engine.

The fault detection system 200 of the present disclosure may detect a resistive short-to-ground fault in the fuel injection system 108. The fault detection system 200 may be configured to detect the short-to-ground resistance $R_s$ at the low-side output of the first fuel injector 112 during normal operation of the engine system, though the driver circuit 116 is inactive. Thus, the fault detection system 200 disables the driver circuit 116 due to short-to-ground fault at the low-side of the fuel injectors. During the short-to-ground fault, turning on the high-side of the fuel injectors may lead to uncontrolled fuelling in the cylinder. Therefore, over-fueling and/or untimely fueling in the first and the second cylinders 102 and 104 due to a resistive short-to-ground fault may be avoided. The fault detection system 200 may also not interfere with a normal operation of the fuel injection system 108. During the active state of the driver circuit 116, the second switch 220 is not providing any signal to the controller 146. Further, the pull-up voltage $V_p$ may be disabled during operation of the driver circuit 116.

Various parameters associated with the fault detection system 200 may also be adjusted based on an estimated amount of the resistance $R_s$. In an example, a maximum value of the short-to-ground resistance $R_s$ may be estimated based on various aspects of the fuel injection system 108. Thereafter, the pull-up voltage $V_p$, the pull-up resistance 216 and the reference voltage $V_r$ may be adjusted so that the fault detection system 200 may be able to detect a resistive short-to-ground fault if the short-to-ground resistance $R_s$ is equal to or less than the maximum estimated value. In an embodiment, the operator interface associated with the controller 146 may be used to dynamically adjust the pull-up voltage $V_p$, the pull-up resistor 216 and the reference voltage $V_r$. The operator interface may include one or more dials, buttons, or other inputs for adjusting the various parameters of the fault detection system 200. Thus, an operator may be able to conveniently tune the fault detection system 200 for testing various types of fuel injector systems having different estimated amounts of short-to-ground resistance. The operator interface may also provide one or more types of feedback to the operator in case a resistive short-to-ground fault is detected. The fault may then be rectified before an operation of the fuel injection system 108 or as soon as the fault is detected during periods of time in between operation of each injector.

Figure 3:
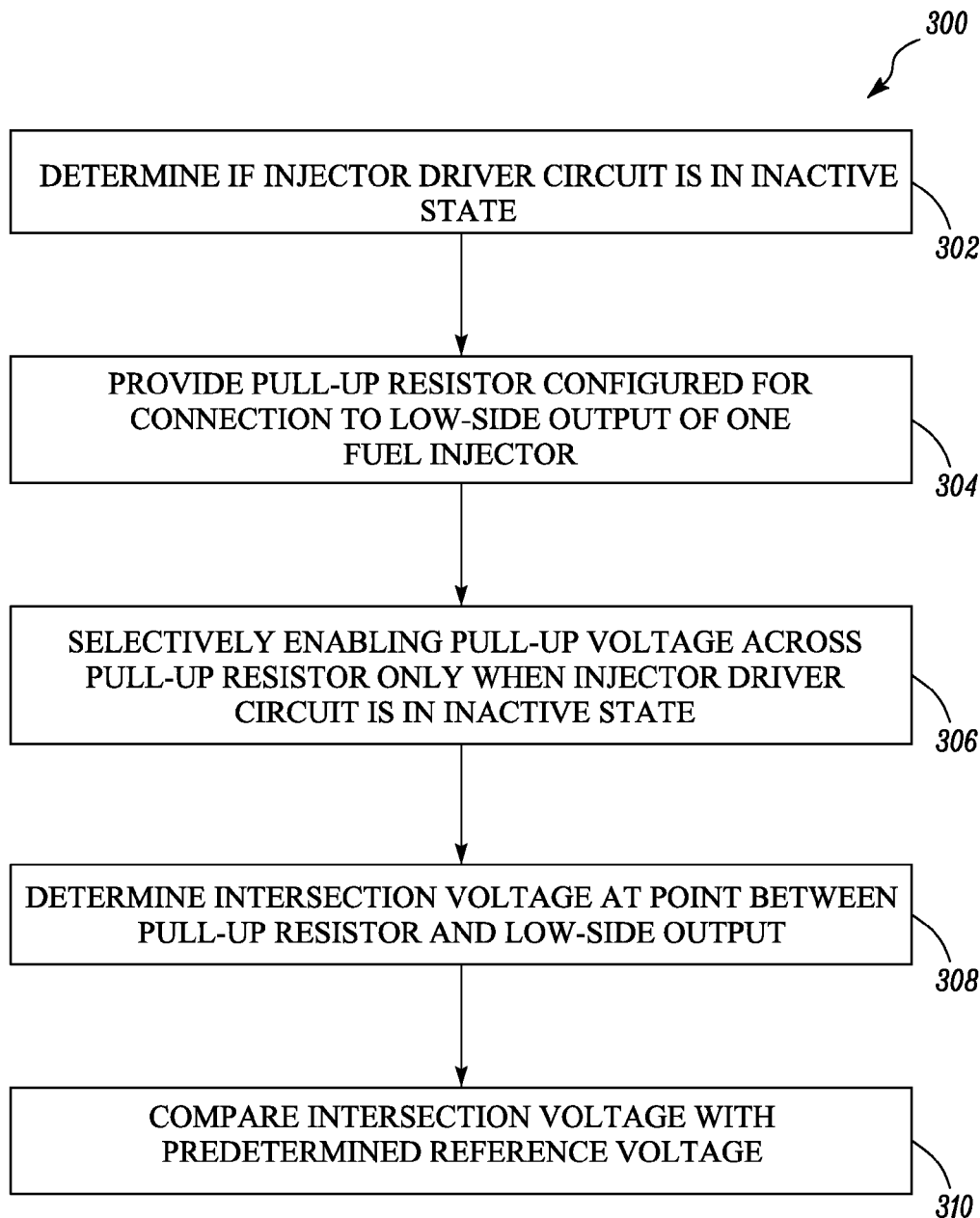
FIG. 3 is a flowchart showing a method of detecting a resistive short-to-ground fault, according to an embodiment of the present disclosure.

The present disclosure also relates to a method 300 for detecting the resistive short-to-ground fault in the fuel injection system 108. FIG. 3 illustrates the method 300 for detecting the resistive short-to-ground fault, according to an embodiment of the present disclosure. At step 302, the method 300 includes determining if the driver circuit 116 is in the inactive state. The state of the driver circuit 116 is determined with the help of the state detection module 202. The first switch 208 of the state detection module 202 provides the high state output if the first selector switch 132 corresponding to the first fuel injector 112 of the driver circuit 116 is not actuated by the controller 146.

At step 304, the method includes providing the pull-up resistor 216 that is connected to the low-side output of the first fuel injector 112. The method 300 further includes selecting the resistance value of the pull-up resistor 216 based on an amount of the short-to-ground resistance $R_s$ between the low-side output of the first fuel injector 112 and ground that is considered to be the resistive short-to-ground fault.

At step 306, the method 300 includes selectively enabling the pull-up voltage $V_p$ across the pull-up resistor 216 only when the driver circuit 116 is in an inactive state. The state detection module 202 may detect the inactive state of the driver circuit 116 and communicate the high state output to the base region of the first switching device 210. Upon actuation of the first switching device 210, current starts to flow therethrough and further actuates the second switching device 212 via the base region thereof. Upon actuation of the second switching device 212, the controller 146 enables the pull-up voltage $V_p$ across the pull-up resistor 216 via the emitter region of the second switching device 212.

At step 308, the method 300 includes determining the intersection voltage $V_f$ at a point 217 between the pull-up resistor 216 and the low-side output. The intersection voltage $V_f$ at the point 217 between the pull-up resistor 216 and the low-side output of the first fuel injector 112 may be determined based on a voltage drop across the short-to-ground resistance $R_s$. The voltage drop across the short-to-ground resistance $R_s$ may be determined by subtracting predetermined voltage drops across the second switching device 212 and the diode 214 from the pull-up voltage $V_p$. The intersection voltage $V_f$ may then be determined by a product of the voltage value obtained after subtracting the voltage drops and the ratio between the resistance $R_s$, and sum of the short-to-ground resistance $R_s$ and the pull-up resistor 216

At step 310, the method 300 includes comparing the intersection voltage $V_f$ to the reference voltage $V_r$. The voltage comparator 218 of the output module 206 receives the intersection voltage $V_f$ from the pull-up module 204. The voltage comparator 218 may then compare the intersection voltage $V_f$ with the reference voltage $V_r$. The voltage comparator 218 may provide the high state output if the intersection voltage $V_f$ is less than the reference voltage $V_r$. Further, the voltage comparator 218 may provide the low state output if the intersection voltage $V_f$ is higher than the reference voltage $V_r$. The high state or low state outputs of the voltage comparator 218 are then communicated to the second switch 220. The second switch 220 also receives the state of the driver circuit 116 via the first switch 208 and provides the high state output $V_o$ only if both the outputs from the voltage comparator 218 and the first switch 208 are in high state.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A method of detecting a resistive short-to-ground fault in an injector driver circuit, the method comprising:
   determining if the injector driver circuit is in an inactive state;
   providing a pull-up resistor configured for connection to a low-side output of at least one fuel injector;
   selectively enabling a pull-up voltage across the pull-up resistor only when the injector driver circuit is in the inactive state;
   determining an intersection voltage at a point between the pull-up resistor and the low-side output; and
   comparing the intersection voltage with a predetermined reference voltage.

2. The method of claim 1, further comprising selecting a resistance value of the pull-up resistor based at least in part on an amount of resistance between the low-side output of at least one fuel injector and ground that is considered to be a resistive short-to-ground fault.

3. The method of claim 2, further comprising selecting a voltage value for the pull-up voltage based at least in part on the amount of resistance considered to be the resistive short-to-ground fault.

4. The method of claim 3, further comprising selecting a voltage value for the predetermined reference voltage based at least in part on the amount of resistance considered to be the resistive short-to-ground fault.

5. The method of claim 1, further comprising generating a high state output indicative of the injector driver circuit being in the inactive state if the intersection voltage is less than the predetermined reference voltage.

6. The method of claim 1, wherein determining the intersection voltage comprises measuring a voltage drop across a resistance between the low-side output of a fuel injector and ground considered to be the resistive short-to-ground fault.

7. A fault detection system for detecting a resistive short-to-ground fault in an injector driver circuit, the fault detection system comprising:
   a state detection module configured to detect whether the injector driver circuit is in an inactive state;
   a pull-up module operatively coupled to the state detection module, the pull-up module comprising a pull-up resistor connected to a low-side output of the fuel injector, wherein the pull-up module is configured to:
      selectively enable a pull-up voltage applied across the pull-up resistor only when the injector driver circuit is in the inactive state; and
      determine an intersection voltage at a point between the pull-up resistor and the low-side output; and
   an output module operatively coupled to the state detection module and the pull-up module, wherein the output module is configured to compare the intersection voltage with a predetermined reference voltage.

8. The fault detection system of claim 7, wherein a resistance value of the pull-up resistor is based at least in part on an amount of resistance between the low-side output of the fuel injector and ground that is considered to be a resistive short-to-ground fault.

9. The fault detection system of claim 8, wherein a voltage value for the pull-up voltage is based at least in part on the amount of resistance considered to be the resistive short-to-ground fault.

10. The fault detection system of claim 9, wherein a voltage value for the predetermined reference voltage is based at least in part on the amount of resistance considered to be the resistive short-to-ground fault.

11. The fault detection system of claim 7, wherein the pull-up module comprises:
    a first switching device in communication with the state detection module; and
    a second switching device in communication with the first switching device and the pull-up voltage;
    wherein the first switching device is configured to actuate the second switching device in order to selectively enable the pull-up voltage across the pull-up resistor only when the injector driver circuit is in the inactive state.

12. The fault detection system of claim 7, wherein the intersection voltage is measured as a voltage drop across a resistance between the low-side output of a fuel injector and ground considered to be the resistive short-to-ground fault.

13. The fault detection system of claim 7, wherein the output module is further configured to provide a fault signal when the intersection voltage is less than the predetermined reference voltage.

14. The fault detection system of claim 7, wherein the state detection module comprises a first switch operatively connected to a selector switch disposed on the low-side output of the fuel injector, and wherein the first switch is configured to provide a high state output when the injector driver circuit is in the inactive state.

15. The fault detection system of claim 7, wherein the output module comprises:
    a voltage comparator operatively coupled to the pull-up module and configured to:
        compare the intersection voltage with the predetermined reference voltage; and
        provide a high state output when the intersection voltage is less than the predetermined reference voltage; and
    a second switch operatively coupled to the voltage comparator and the state detection module, wherein the second switch is configured to output a fault signal when the output from the voltage comparator is in the high state and the injector driver circuit is in the inactive state.

16. The fault detection system of claim 15, wherein the second switch is further configured to provide a low state output during an active state of the driver circuit.

17. An injector driver circuit for a fuel injection system having a plurality of fuel injectors, the injector driver circuit comprising:
    a power source;
    a selector switch associated with each of the plurality of fuel injectors and located on a low-side output of each of the injectors, each selector switch being configured to selectively connect and disconnect an associated fuel injector to allow power from the power source to pass through the associated fuel injector; and
    a fault detection system configured to detect a resistive short-to-ground fault in the injector driver circuit, the fault detection system comprising:
        a state detection module operatively coupled to the selector switch of at least one of the fuel injectors, wherein the state detection module is configured to detect a state of the injector driver circuit;
        a pull-up module operatively coupled to the state detection module, the pull-up module comprising a pull-up resistor connected across the low-side output of at least one of the plurality of fuel injectors, wherein the pull-up module is configured to:
            selectively enable a pull-up voltage applied across the pull-up resistor only when the injector driver circuit is in an inactive state; and
            determine an intersection voltage at a point between the pull-up resistor and the low-side output; and
        an output module operatively coupled to the state detection module and the pull-up module, wherein the output module is configured to compare the intersection voltage with a predetermined reference voltage.

18. The injector driver circuit of claim 17, wherein a resistance value of the pull-up resistor is based at least in part on an amount of resistance between the low-side output of one of the plurality of fuel injectors and ground that is considered to be a resistive short-to-ground fault.

19. The injector driver circuit of claim 18, wherein a voltage value for the pull-up voltage is based at least in part on the amount of resistance considered to be the resistive short-to-ground fault.

20. The injector driver circuit of claim 19, wherein a voltage value for the predetermined reference voltage is based at least in part on the amount of resistance considered to be the resistive short-to-ground fault.

* * * * *